(12) United States Patent
Yasuda et al.

(10) Patent No.: US 6,759,283 B2
(45) Date of Patent: Jul. 6, 2004

(54) THIN FILM TRANSISTOR AND METHOD OF FABRICATING THE SAME

(75) Inventors: Kyounei Yasuda, Tokyo (JP); Satoshi Ihida, Tokyo (JP); Jukoh Funaki, Akita (JP); Manabu Oyama, Akita (JP); Yoshikazu Hatazawa, Akita (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 17 days.

(21) Appl. No.: 10/145,120

(22) Filed: May 15, 2002

(65) Prior Publication Data

US 2002/0171084 A1 Nov. 21, 2002

(30) Foreign Application Priority Data

May 16, 2001 (JP) ........................................ 2001-146147
May 8, 2002 (JP) ........................................ 2002-132556

(51) Int. Cl.⁷ .............................................. H01L 21/00
(52) U.S. Cl. ...................... 438/149; 438/151; 438/157; 438/166; 438/384; 257/66
(58) Field of Search ................................. 438/149, 151, 438/157, 166, 384; 257/66

(56) References Cited

U.S. PATENT DOCUMENTS 5,858,819 A * 1/1999 Miyasaka ................... 438/149

FOREIGN PATENT DOCUMENTS

| JP | 362051264 A | * | 3/1987 |
|---|---|---|---|
| JP | 63-132433 | | 6/1988 |
| JP | 403116737 A | * | 5/1991 |
| JP | 404007843 A | * | 1/1992 |
| JP | 04-122072 | | 4/1992 |
| JP | 6-9246 | | 2/1994 |
| JP | 08-338998 | | 12/1996 |
| JP | 2621619 | | 4/1997 |
| JP | 2001-60690 | | 3/2001 |
| JP | 2001060690 A | * | 3/2001 |

OTHER PUBLICATIONS

Japanese Office Action dated Jul. 29, 2003 with a partial English translation.

* cited by examiner

Primary Examiner—David Nelms
Assistant Examiner—Andy Huynh
(74) Attorney, Agent, or Firm—McGinn & Gibb, PLLC

(57) ABSTRACT

A method of fabricating a thin film transistor, includes the steps of (a) forming a gate electrode on an electrically insulating substrate, (b) forming a gate insulating film on the electrically insulating substrate, covering the gate electrode therewith, (c) forming a semiconductor layer on the gate insulating film above the gate electrode, (d) forming source and drain electrodes both making electrical contact with the semiconductor layer, (e) patterning the semiconductor layer into a channel, (f) applying first plasma to the semiconductor layer through the use of a first gas, and (g) applying second plasma to the semiconductor layer through the use of a second gas, and (h) forming an electrically insulating film covering the semiconductor layer therewith.

33 Claims, 12 Drawing Sheets

THIN FILM TRANSISTOR AND METHOD OF FABRICATING THE SAME

BACKGROUND OF THE INVENTION

1. Field of the Invention

The invention relates to a thin film transistor and a method of fabricating the same, and more particularly to a thin film transistor having a reverse-stagger structure and being capable of reducing off-leakage current, and a method of fabricating such a thin film transistor.

2. Description of the Related Art

There has been developed an active matrix type liquid crystal display device including a thin film transistor (TFT) as a switching device for a liquid crystal display. An active matrix type liquid crystal display device is designed to generally include an active matrix substrate having a gate wiring, a drain wiring, a thin film transistor, a pixel electrode and so on, an opposing substrate having a color filter, a black matrix layer and so on, and a liquid crystal layer sandwiched between the active matrix substrate and the opposing substrate. In an active matrix type liquid crystal display device, a direction in which liquid crystal molecules are oriented is rotated in accordance with a voltage applied either across electrodes arranged on both an active matrix substrate and an opposing substrate or between electrodes arranged in an active matrix substrate, to thereby control a light passing through a liquid crystal layer in each of pixels for displaying desired images on a display screen.

On the assumption that a semiconductor layer is formed above an active matrix substrate, a thin film transistor is grouped into a forward-stagger type one in which a gate electrode is formed above the semiconductor layer and source/drain electrodes are formed below the semiconductor layer, and a reverse-stagger type one in which a gate electrode is formed below the semiconductor layer and source/drain electrodes are formed above the semiconductor layer. A thin film transistor is generally designed to have a reverse-stagger structure.

FIG. 1 is a cross-sectional view of a conventional active matrix type liquid crystal display device having a reverse-stagger structure.

With reference to FIG. 1, in the conventional active matrix substrate, a gate electrode 2a is formed on a glass substrate 1, and a gate insulating film 3 is formed on the glass substrate 1, covering the gate electrode 2a therewith. On the gate insulating film 3 are formed an island-shaped amorphous silicon (hereinafter, referred to simply as "a-Si") layer 4a which will make a semiconductor layer in a thin film transistor, and an n$^+$ a-Si layer 4b containing much n-type impurity. The a-Si layer 4a and the n$^+$ a-Si layer 4b are partially removed to define a channel 4d. A drain electrode 5a and a source electrode 5b are formed on the n$^+$ a-Si layer 4b around the channel 4d.

A passivation insulating film 7 is formed on the gate insulating film 3, covering the drain electrode 5a and the source electrode 5b therewith, in order to planarize a surface of the active matrix substrate.

The passivation insulating film 7 is partially removed above the source electrode 5b to define a contact 6. A pixel electrode 8 comprised of an electrically conductive transparent film such as a film composed of indium tin oxide (ITO) is formed in the contact 6 and each of pixels. An alignment film 9 is formed covering the pixel electrode 8 and the passivation insulating film 7 therewith.

Though not illustrated, red, green and blue color filters are formed on a glass substrate in each of pixels in the opposing substrate. An overcoating layer is formed on the color filters, and a transparent electrode composed of ITO is formed on the overcoating layer. Similarly to the active matrix substrate, an alignment film is formed on the transparent electrode in facing relation to the alignment film 9 of the active matrix substrate. The alignment films of both the active matrix substrate and opposing substrate are oriented into a predetermined direction.

The active matrix substrate and the opposing substrate are fixed to each other with spacers being sandwiched therebetween to define a gap therebetween. Liquid crystal is introduced into the gap.

In order to ensure desired switching characteristic in an active matrix type liquid crystal display device, it is generally important that an ON current, that is, a current running across source/drain electrodes when a gate is on is relatively high, and an OFF current, that is, a current running across source/drain electrodes when a gate is off is relatively small.

However, the conventional active matrix type liquid crystal display device having such a structure as mentioned above is accompanied with a problem that an off-leakage current is produced in a back-channel due to charging up in the spacers located above a thin film transistor and/or the alignment film 9, and causes malfunction in the thin film transistor with the result of display defect.

In order to prevent an off-leakage current to be produced in a back-channel, Japanese Patent No. 2621619 and Japanese Patent Publication No. 6-9246 have suggested an active matrix type liquid crystal display device in which an inactive layer is formed at a surface of an amorphous silicon layer which defines a channel.

Hereinbelow is explained the suggested active matrix type liquid crystal display device with reference to FIGS. 2A to 2C and 3.

FIGS. 2A to 2C are cross-sectional views of the active matrix substrate suggested in Japanese Patent No. 2621619, illustrating respective steps of a method of fabricating the same.

The active matrix substrate suggested in Japanese Patent No. 2621619 is fabricated as follows.

First, as illustrated in FIG. 2A, a metal film such as a chromium film is formed on an electrically insulating transparent substrate 19. Then, the metal film is patterned by photolithography and etching into a gate electrode 2a.

Then, as illustrated in FIG. 2B, a gate insulating film 3 is formed on the electrically insulating transparent substrate 19, covering the gate electrode 2a therewith. Then, a semiconductor layer 20 is formed on the gate insulating film 3.

Then, as illustrated in FIG. 2C, the semiconductor layer 20 is exposed to hydrogen plasma 21 to thereby inactivate the semiconductor layer 20 at its surface.

Then, though not illustrated, a protection film is formed over the semiconductor layer 20, and there are formed source/drain electrodes which make electrical contact with the semiconductor layer 20 through contact holes formed around a channel. Then, a second protection film is formed covering a resultant therewith.

As mentioned above, in the method of fabricating an active matrix type liquid crystal display device disclosed in Japanese Patent No. 2621619, the semiconductor layer 20 is exposed to the hydrogen plasma 21 before the formation of a protection film for protecting a thin film transistor, to thereby increase a surface level at an interface between the semiconductor layer 20 and the protection layer. As a result, a back-channel in the thin film transistor is inactivated, and resultingly, a leakage current running through the back-channel while the thin film transistor is off can be reduced.

FIG. 3 is a cross-sectional view of an active matrix substrate suggested in the above-mentioned Japanese Patent Publication No. 6-9246.

In the suggested active matrix substrate, a gate electrode 2a composed of NiCr is formed on a glass substrate 1. A gate insulating film 3 is formed on the glass substrate 1, covering the gate electrode 2a therewith. An amorphous silicon layer 4a and an n$^+$ amorphous silicon layer 4b are formed on the gate insulating film 3. A back-channel is formed by partially removing both the n$^+$ amorphous silicon layer 4b and the amorphous silicon layer 4a by dry etching. The amorphous silicon layer 4a is formed at a surface thereof with a modified layer 22 containing oxygen, carbon and other element, by exposing the amorphous silicon layer 4a to plasma in a gas atmosphere in which at least one of nitrogen, oxygen, carbon and boron exists, in an apparatus in which a dry-etching process is carried out.

As mentioned above, in the above-mentioned Japanese Patent Publication No. 6-9246, after being dry-etched for forming a back-channel, the amorphous silicon layer is exposed to plasma in the above-mentioned gas atmosphere in an apparatus in which the semiconductor was dry-etched for forming a back-channel, to thereby form the modified layer 22, which is a stable layer, at a surface of the amorphous silicon layer 4a at the back-channel. This ensures reduction in an OFF current in a thin film transistor.

In accordance with the above-mentioned conventional methods of fabricating an active matrix substrate, it is possible to reduce an off-leakage current to some degree by inactivating a back-channel.

However, the first mentioned conventional method is accompanied with a problem that since the semiconductor layer 20 is exposed to atmosphere after being fabricated, the semiconductor layer 20 is contaminated at a surface thereof, resulting in probability in variance in potential at the back-channel.

The second mentioned conventional method overcomes the above-mentioned problem of contamination of the semiconductor layer, since the semiconductor layer is exposed to oxygen plasma in an apparatus in which dry etching is to be carried out.

However, both of the above-mentioned conventional active matrix substrates cannot be sufficiently inactivated by plasma, cannot effectively suppress generation of an off-leakage current, and cannot avoid display defect on a display screen.

SUMMARY OF THE INVENTION

In view of the above-mentioned problems in the conventional active matrix substrates, it is an object of the present invention to provide a thin film transistor and a method of fabricating the same both of which are capable of preventing an off-leakage current from being produced at a back-channel by spacers located above a thin film transistor and charging-up of an alignment film, and further preventing display defect.

In one aspect of the present invention, there is provided a method of fabricating a thin film transistor, comprising the steps of (a) forming a semiconductor layer above an electrically insulating substrate, (b) applying first plasma to the semiconductor layer through the use of a first gas, and (c) applying second plasma to the semiconductor layer through the use of a second gas.

It is preferable that the step (a) includes the step of forming the semiconductor layer composed of amorphous silicon or polysilicon.

It is preferable that each of the first and second gases contains at least one of oxygen (O), nitrogen (N), carbon (C), boron (B), hydrogen (H) and helium (He).

It is preferable that the first gas is comprised of oxygen, and the second gas is comprised of hydrogen and nitrogen.

It is preferable that the method further includes the step of heating the electrically insulating substrate at a predetermined temperature before applying the second plasma to the semiconductor layer.

The predetermined temperature is preferably in the rage of 250 degrees centigrade to 350 degrees centigrade both inclusive, and more preferably in the rage of 280 degrees centigrade to 320 degrees centigrade both inclusive.

It is preferable that the step of heating the electrically insulating substrate at the predetermined temperature is carried out for ten minutes or longer.

It is preferable that the second gas contains an element having an atomic number smaller than an atomic number of at least one of elements of the first gas.

There is further provided a method of fabricating a thin film transistor, comprising the steps of (a) forming a gate electrode on an electrically insulating substrate, (b) forming a gate insulating film on the electrically insulating substrate, covering the gate electrode therewith, (c) forming a semiconductor layer on the gate insulating film above the gate electrode, (d) forming source and drain electrodes both making electrical contact with the semiconductor layer, (e) patterning the semiconductor layer into a channel, (f) applying first plasma to the semiconductor layer through the use of a first gas, and (g) applying second plasma to the semiconductor layer through the use of a second gas, and (h) forming an electrically insulating film covering the semiconductor layer therewith.

The electrically insulating film in the step (h) is formed at power preferably in the range of 0.05 to 1.0 W/cm$^2$ both inclusive, and more preferably in the range of 0.05 to 0.2 W/cm$^2$ both inclusive.

There is still further provided a method of fabricating a thin film transistor, comprising the steps of (a) forming a semiconductor layer in a film-forming apparatus, (b) introducing a first gas into the film-forming apparatus to apply first plasma to the semiconductor layer, (c) introducing a second gas into the film-forming apparatus to apply second plasma to the semiconductor layer, (d) patterning the semiconductor layer into a channel, (e) forming a channel protection layer over the channel in the film-forming apparatus, and (f) forming an electrically insulating film covering the semiconductor layer therewith.

In the above-mentioned method in accordance with the present invention, there is no order in carrying out the step of applying first plasma to a semiconductor layer through the use of a first gas, and the step of applying second plasma to a semiconductor layer through the use of a second gas. The step of applying first plasma to a semiconductor layer through the use of a first gas may be carried out earlier than the step of applying second plasma to a semiconductor layer through the use of a second gas. As an alternative, the step of applying second plasma to a semiconductor layer through the use of a second gas may be carried out earlier than the step of applying first plasma to a semiconductor layer through the use of a first gas.

In another aspect of the present invention, there is provided a thin film transistor including a semiconductor layer including at least one element of a first gas and at least one element of a second gas, wherein the second gas contains an element having an atomic number smaller than an atomic number of at least one of elements of the first gas, and the element of the first gas is higher in concentration in the vicinity of the semiconductor layer than the element of the second gas, and the element of the second gas is higher in concentration than the element of the second gas in regions of the semiconductor layer deeper than the surface.

It is preferable that the element of the first gas is introduced into the semiconductor layer by applying first plasma to the semiconductor layer, and the element of the second gas is introduced into the semiconductor layer by applying second plasma to the semiconductor layer.

It is preferable that the first gas contains at least one of oxygen (O), nitrogen (N), carbon (C) and boron (B), and the second gas contains at least hydrogen (H).

It is preferable for the thin film transistor in accordance with the present invention to have such a back-gate characteristic that a drain current is equal to or smaller than $1 \times 10^{-10}$ A when a drain voltage is equal to 10V, a front gate voltage is equal to –10V, and a back gate voltage is equal to 10V.

The advantages obtained by the aforementioned present invention will be described hereinbelow.

The present invention makes it possible to suppress an off-leakage current at a back-channel by forming a stable inactivated layer, reducing a stress of an electrically insulating layer, and preventing the semiconductor layer from being damaged when the electrically insulating layer is formed.

The reason is as follows.

As will be explained later in the first embodiment, in accordance with the present invention, the first and second plasma steps are carried out after a semiconductor layer is etched for forming a channel, but before an electrically insulating film is formed. In the first plasma step, the semiconductor layer is exposed to oxygen plasma, and in the second plasma step, the semiconductor layer is exposed to hydrogen plasma. The second plasma step ensures that a region of the semiconductor layer into which oxygen atoms could not enter is inactivated.

In addition, the semiconductor layer is facilitated to be inactivated by heating a substrate at a predetermined temperature.

Furthermore, by forming an electrically insulating film on the inactive layer at power equal to or smaller than predetermined power, it would be possible to form a stable inactive layer, reduce a stress of the inactive layer, and prevent the inactive layer from being damaged while the electrically insulating film is being formed.

By carrying out the above-mentioned steps, it would be possible to form a stable inactive layer, and hence, suppress an off-leakage current at a back-channel.

As will be explained later in the second embodiment, an inactive layer is formed at a surface of a semiconductor layer by applying first plasma such as oxygen plasma to the semiconductor layer in an apparatus in which a channel protection layer is to be formed, and then, the inactive layer is further inactivated by heating a substrate at a predetermined temperature.

In addition, second plasma such as oxygen plasma is applied to the semiconductor layer to form an inactive layer in a region of the semiconductor layer into which oxygen atoms could not enter in the first plasma step.

As a result, it would be possible to form a stable inactive layer, and hence, suppress an off-leakage current at a back-channel.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

First Embodiment

An active matrix type liquid crystal display device in accordance with the first embodiment of the present invention and a method of fabricating the same are explained hereinbelow with reference to FIGS. 4, 5, 6A to 6E, 7A and 7B.

The active matrix type liquid crystal display device in accordance with the first embodiment is a channel-etched type active matrix liquid crystal display device having a reverse-stagger structure.

Figure 1:
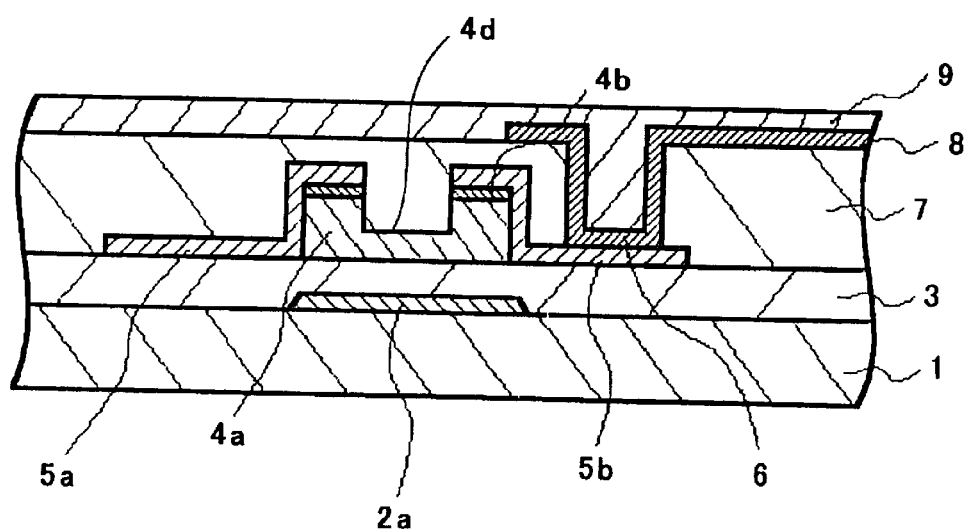
FIG. 1 is a cross-sectional view of a conventional active matrix substrate.
Figure 2A:
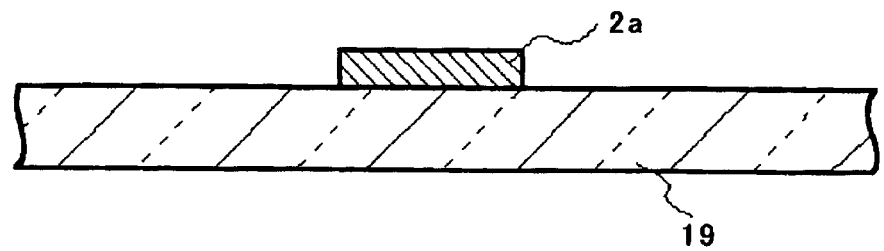
FIGS. 2A to 2C are cross-sectional views of another conventional active matrix substrate, illustrating respective steps of a method of fabricating the same.
Figure 2B:
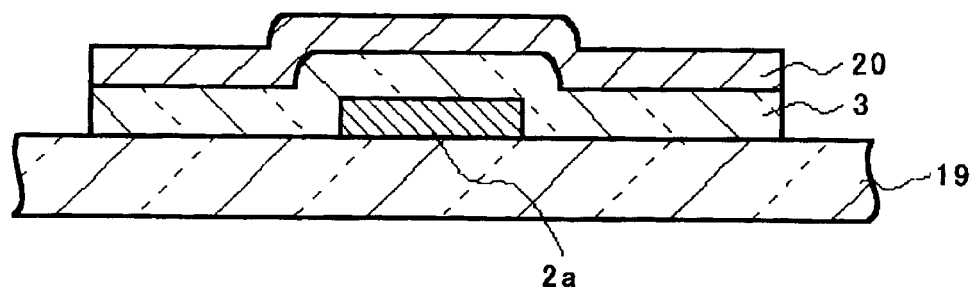
Figure 2C:
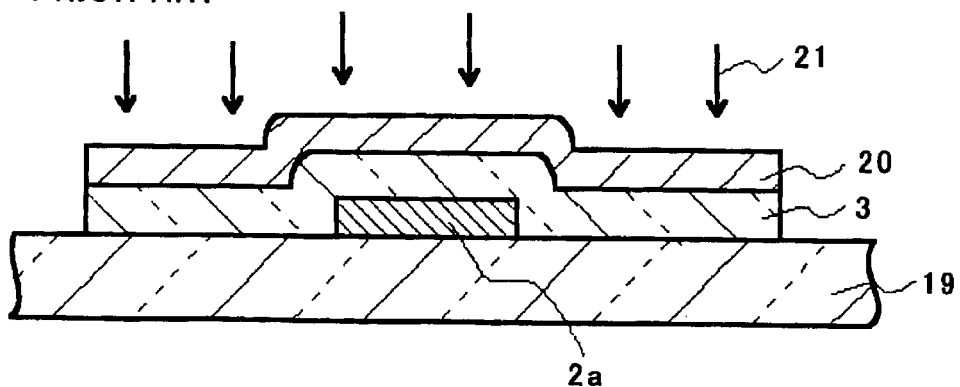
Figure 3:
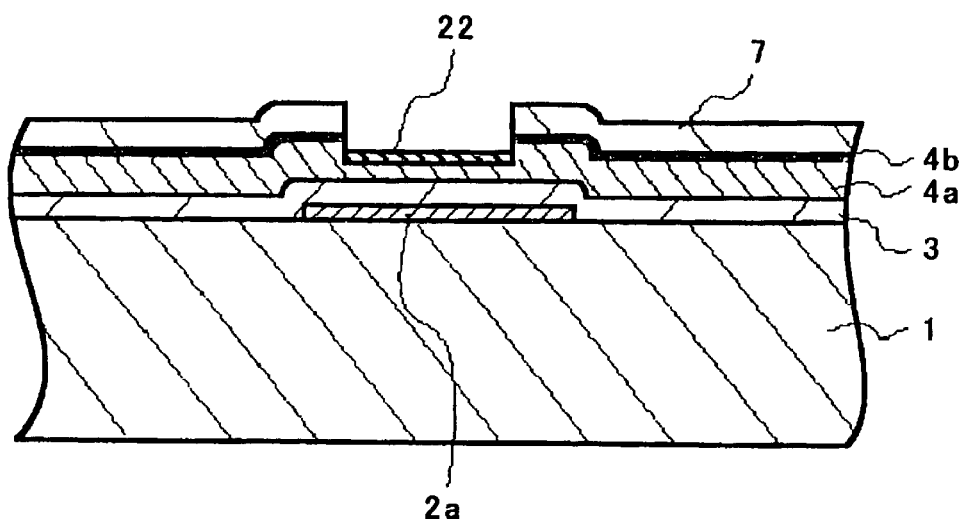
FIG. 3 is a cross-sectional view of still another conventional active matrix substrate.
Figure 4:
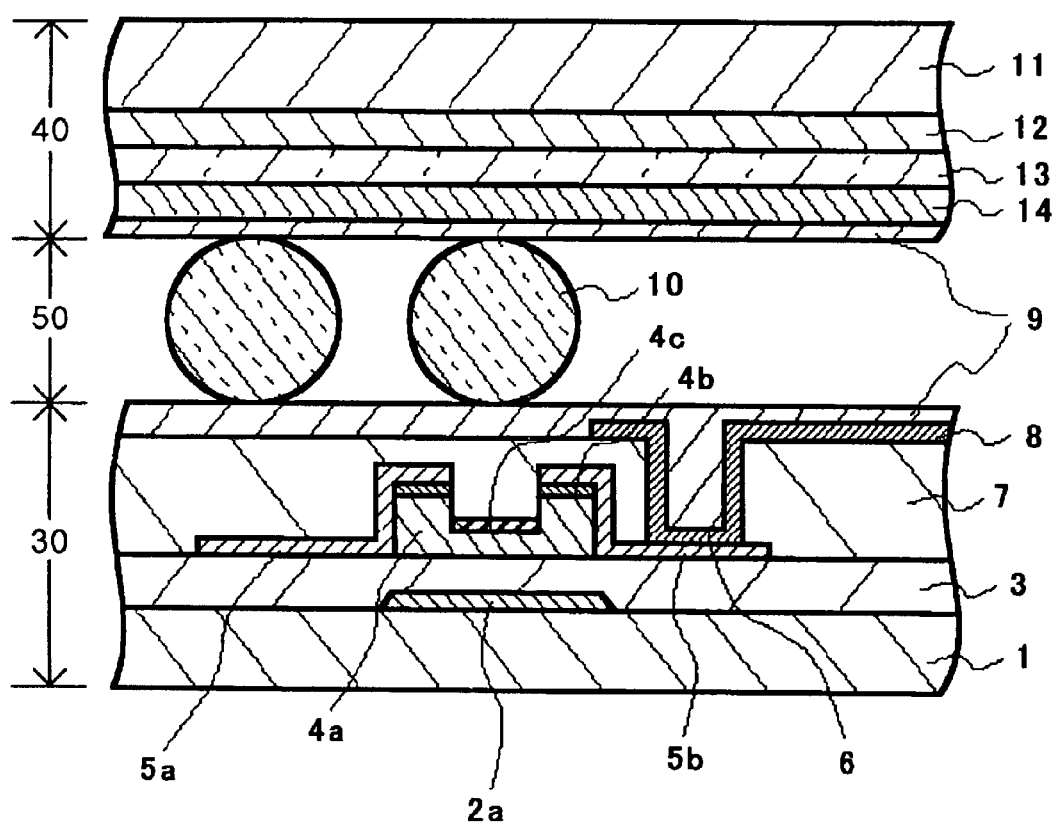
FIG. 4 is a cross-sectional view of the active matrix type liquid crystal display device in accordance with the first embodiment.
Figure 5:
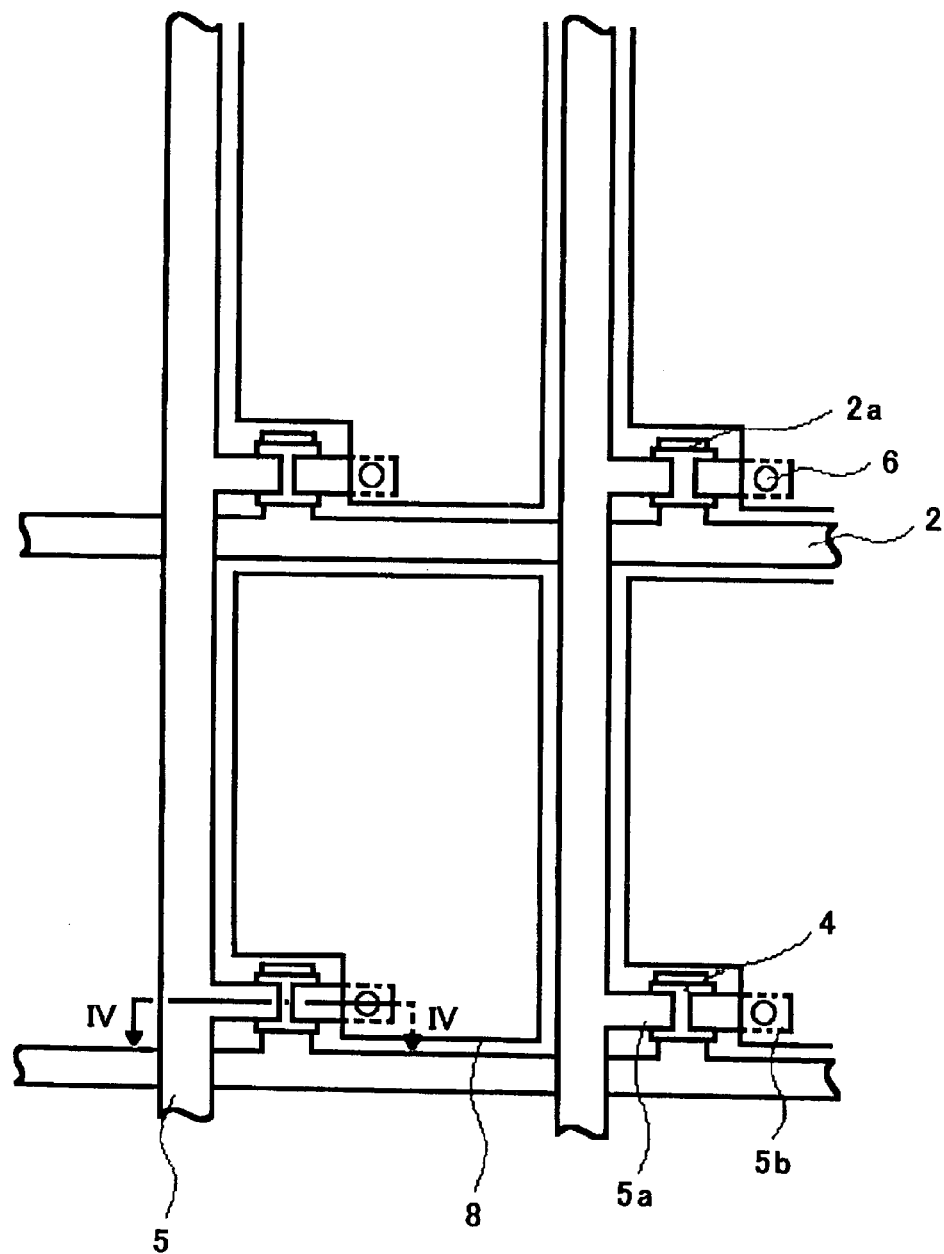
FIG. 5 is a plan view of the active matrix type liquid crystal display device in accordance with the first embodiment.

FIG. 4 is a cross-sectional view of the active matrix type liquid crystal display device in accordance with the first embodiment, and FIG. 5 is a plan view of the same. FIG. 4 is a cross-sectional view taken along the line IV—IV in FIG. 5.

With reference to FIG. 4, the active matrix type liquid crystal display device in accordance with the first embodiment is comprised of a substrate 30 on which a thin film transistor (TFT) is fabricated (hereinbelow, referred to simply as "TFT substrate 30"), an opposing substrate 40 arranged in facing relation to the TFT substrate 30, and a liquid crystal layer 50 sandwiched between the TFT substrate 30 and the opposing substrate 40.

The TFT substrate 30 is comprised of a glass substrate 1, a gate electrode 2a formed on the glass substrate 1, a gate insulating film 3 formed on the glass substrate 1, covering the gate electrode 2a therewith, an amorphous silicon (hereinbelow, referred to simply as "a-Si") layer 4a formed on the gate insulating film 3 above the gate electrode 2a, an $n^+$ a-Si layer 4b formed on the a-Si layer 4a, an inactive layer 4c formed in a channel formed at a surface of the a-Si layer 4a above the gate electrode 2a, a drain electrode 5a and a source electrode 5b both formed on the gate insulating film 3, covering the $n^+$ a-Si layer 4b therewith, a passivation insulating film 7 formed on the gate insulating film 3, covering the inactive layer 4c, the drain electrode 5a and the source electrode 5b therewith, a pixel electrode 8 formed on the passivation insulating film 7 and making electrical contact with the source electrode 5b through a contact 6 formed by partially removing the passivation insulating film 7, and an alignment film 9 covering the passivation insulating film 7 and the pixel electrode 8 therewith.

With reference to FIG. 5, on the TFT substrate 30 are formed gate lines 2 and drain lines 5 perpendicularly to each other. Thin film transistors (TFTs) 4 acting as a switching device are arranged in the vicinity of intersections of the gate lines 2 and the drain lines 5. As illustrated in FIG. 4, each of the thin film transistors 4 is formed at its back-channel with the inactive layer 4c.

Referring back to FIG. 4, the opposing substrate 40 facing the TFT substrate 30 is comprised of a glass substrate 11, color filters 12 formed on the glass substrate 11 for producing red (R), green (G) and blue (B) images, an overcoating layer 13 formed on the color filter 12, a transparent electrode 14 formed on the overcoating layer 13 and composed of indium tin oxide (ITO), and an alignment film 9 formed on the transparent electrode 14.

A plurality of spacers 10 are sandwiched between the TFT substrate 30 and the opposing substrate 40 for ensuring a thickness of the liquid crystal layer 50. There is formed a seal (not illustrated) around the liquid crystal layer 50 in order to prevent leakage of liquid crystal.

Hereinbelow is explained a method of fabricating the TFT substrate 30, with reference to FIGS. 6A to 6E.

Figure 6A:
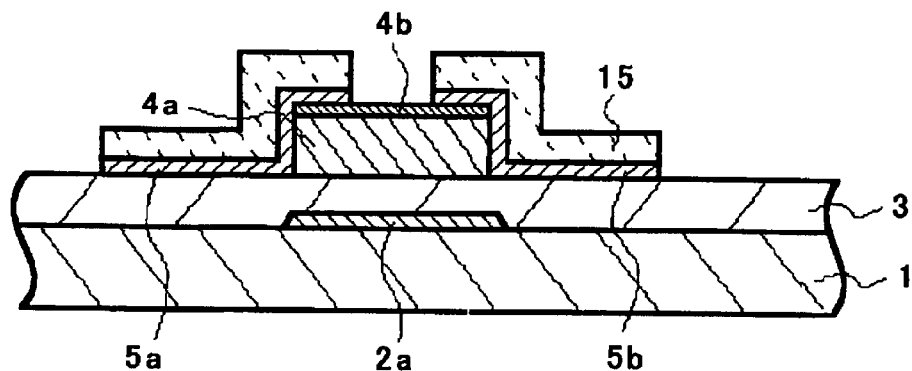
FIGS. 6A to 6E are cross-sectional views of the active matrix type liquid crystal display device in accordance with the first embodiment, illustrating respective steps of a method of fabricating the same.

First, as illustrated in FIG. 6A, TFT 4 is fabricated as follows.

A chromium (Cr) film having a thickness of about 200 nm is formed on the glass substrate 1, for instance, by sputtering. Then, the chromium film is patterned into the gate electrode 2a by lithography and dry etching.

Then, the gate insulating film 3 having a thickness of about 500 nm and composed of silicon nitride is formed on the glass substrate 1, for instance, by chemical vapor deposition (CVD). Then, the a-Si layer 4a which will make a semiconductor layer in TFT 4, and the $n^+$ a-Si layer 4b are successively formed on the gate insulating film 3. The a-Si layer 4a has a thickness of about 300 nm, and the $n^+$ a-Si layer 4b has a thickness of about 50 nm.

After patterning the a-Si layer 4a and the $n^+$ a-Si layer 4b into an island, a chromium film having a thickness of about 150 nm is formed all over the gate insulating film 3, covering the island-shaped a-Si layer 4a and $n^+$ a-Si layer 4b therewith, for instance, by sputtering.

Then, a resist pattern 15 is formed on the chromium film. Then, the resultant is introduced into a dry-etching apparatus. In the dry-etching apparatus, the chromium film is patterned with into the drain lines 5, the drain electrode 5a and the source electrode 5b the resist pattern 15 being used as a mask.

Figure 6B:
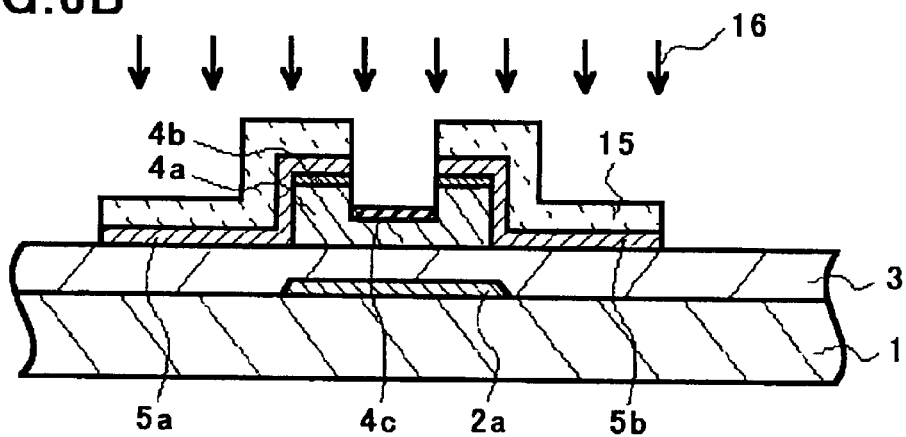

Then, as illustrated in FIG. 6B, both the a-Si layer 4a and the $n^+$ a-Si layer 4b are partially etched such that a channel region sandwiched between the drain electrode 5a and the source electrode 5b appears.

For instance, the a-Si layer 4a and the $n^+$ a-Si layer 4b are etched in the following conditions.

Flow rate of etching gas: 500 sccm

Gas pressure: 20 Pa

RF power: about 600 W

The channel has a depth of about 100 nm from a surface of the a-Si layer 4a.

In a conventional method of fabricating an active matrix substrate, the resultant would be taken out of the dry-etching apparatus, and be introduced into another apparatus for depositing the passivation insulating film 7.

In contrast, in the first embodiment, oxygen gas is introduced into the dry-etching apparatus for carrying out first plasma process, that is, oxygen plasma process in which the a-Si layer 4a is exposed to oxygen plasma 16 as illustrated in FIG. 6B, in order to form the inactive layer 4c at a surface of the a-Si layer 4a without a surface of the a-Si layer 4a being contaminated.

An example of conditions for carrying out the oxygen plasma process is as follows.

Flow rate of oxygen gas: 800 sccm

Pressure of oxygen gas: 140 Pa

Power density: 0.5 $W/cm^2$

Time: about 20 seconds

The reason of the inactive layer 4c being formed by the oxygen plasma process is considered as follows.

The a-Si layer 4a is inactivated at a surface thereof, because non-bonding hands of silicon existing at a surface of the a-Si layer 4a are terminated with oxygen. As an alternative, the a-Si layer 4a is inactivated at a surface thereof, because elements constituting the resist pattern 15 are etched by the oxygen plasma 16 since the oxygen plasma 16 is applied to the a-Si layer 4a with the a-Si layer 4a being covered with the resist pattern 15, and the thus etched elements are absorbed into the a-Si layer 4a at a surface thereof, resulting in that a modified layer as the inactive layer 4c is formed.

In a conventional method of fabricating an active matrix substrate, the resist pattern 15 is removed, and then, the passivation insulating film 7 is formed over the substrate 1.

Figure 6C:
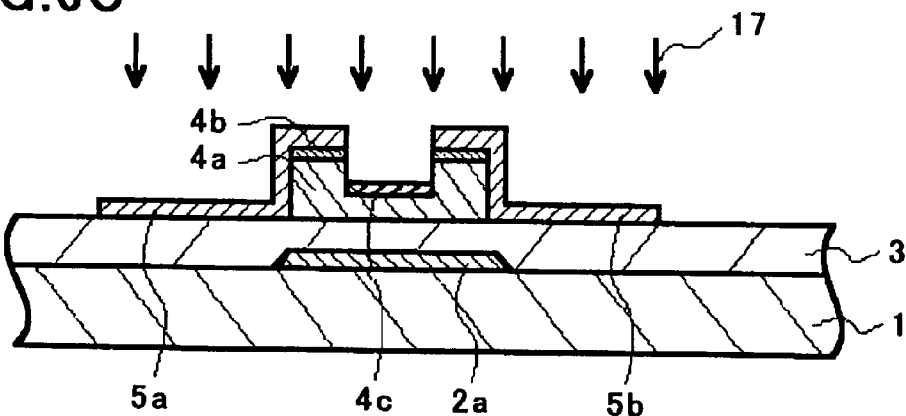

In contrast, in the first embodiment, as illustrated in FIG. 6C, in order to ensure inactivation of a surface of the a-Si layer 4a, that is, to form the inactive layer 4c more certainly, the step of heating the glass substrate 1 and the step of applying hydrogen plasma 17 to the a-Si layer 4a, as the second plasma process, are carried out before the deposition of the passivation insulating film 7.

Specifically, the resultant is introduced into an apparatus for carrying out chemical vapor deposition (CVD) to form the passivation insulating film 7, and the resultant is heated in the apparatus at a temperature in the range of about 250 to about 350 degrees centigrade, more preferably in the range of about 280 to about 320 degrees centigrade, for about ten minutes. Then, the second plasma process is carried out in the following conditions.

Flow rate of hydrogen gas: 1000 sccm
Pressure of hydrogen gas: 70 Pa
Power density: 1.0 W/cm$^2$
Temperature of the substrate: about 300 degrees centigrade
Time: about 10 seconds The step of heating the substrate is carried out for causing hydrogen having been introduced into a surface of the a-Si layer 4a, to be active to thereby facilitate silicon to be terminated with hydrogen. If the substrate is heated at a too high temperature, hydrogen having terminated dangling bonds therewith at a surface of the a-Si layer 4a might be released. On the other hand, if the substrate is heated at a too low temperature, it would not be possible to facilitate termination of dangling bonds with hydrogen at a surface of the a-Si layer 4a.

Accordingly, it is absolutely necessary to heat the substrate at a temperature in a proper range. The inventors had conducted the experiments to determine such a range. The results of the experiments show that it is preferable to heat the substrate at a temperature in the range of about 250 to 350 degrees centigrade, and it is more preferable to heat the substrate at a temperature in the range of about 280 to 320 degrees centigrade.

It is considered that only a region in the vicinity of a surface of the a-Si layer 4a is inactivated by oxygen atoms in the first plasma process, that is, the oxygen plasma process having been carried out in the dry etching apparatus, because oxygen atoms are relatively large. Since hydrogen atoms are smaller in size than oxygen atoms, hydrogen atoms can enter the a-Si layer 4a deeper than oxygen atoms. As a result, it is considered that silicon existing in a region deeper than a surface of the a-Si layer 4a, that is, a region into which oxygen atoms could not reach is terminated with hydrogen atoms, and accordingly, is inactivated.

As mentioned above, a combination of the first plasma process such as the oxygen plasma process and the second plasma process such as the hydrogen plasma process ensures the a-Si layer 4a to be inactivated at a surface thereof, that is, the inactive layer 4c to be formed at a surface of the a-Si layer 4a.

Figure 6D:
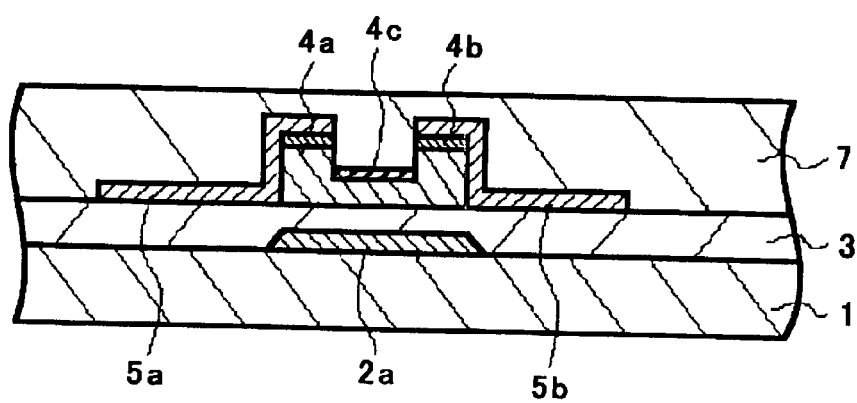

Then, reactive gas is introduced into the CVD apparatus. Then, as illustrated in FIG. 6D, the passivation insulating film 7 is formed over the resultant. The passivation insulating film 7 has a thickness of about 400 nm.

In the first embodiment, power at which the passivation insulating film 7 is formed is set small in the step of forming the passivation insulating film 7 to thereby reduce an off-leakage current at a back-channel.

The reason is as follows.

Even if the inactive layer 4c is formed at a surface of the a-Si layer 4a, if the passivation insulating film 7 is formed on the inactive layer 4c at high power, the a-Si layer 4a would be damaged while the passivation insulating film 7 is being formed, and/or a high residual stress remains in the resultant passivation insulating film 7, with the result that a leakage current is increased at a back-channel.

In order to avoid this problem, in the first embodiment, the passivation insulating film 7 is formed at a power density about five times smaller than a normal power density in order to reduce a residual stress in the resultant passivation insulating film 7 and improve a surface level.

Examples of the conditions (A) for forming the passivation insulating film 7 in the first embodiment and normal conditions (B) for forming the same are shown below.

Figure 6E:
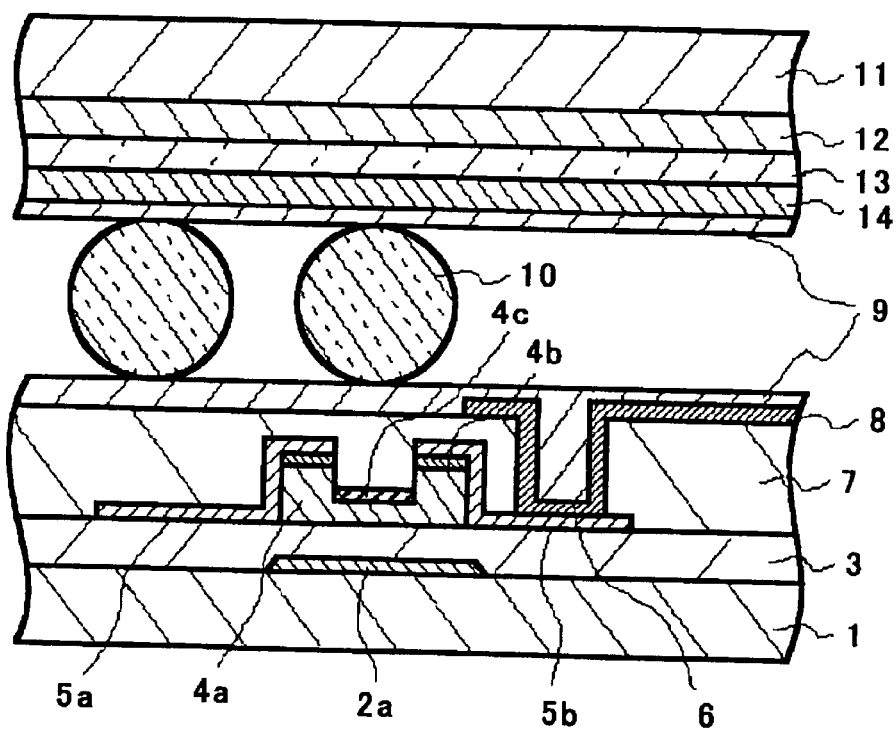

Conditions (A)
Pressure of reactive gas: 200 Pa
Power density: 0.1 W/cm$^2$
Temperature of the substrate: about 300 degrees centigrade Conditions (B)
Pressure of reactive gas: 200 Pa
Power density: 0.5 W/cm$^2$
Temperature of the substrate: about 300 degrees centigrade Then, as illustrated in FIG. 6E, the passivation insulating film 7 is partially removed above the source electrode 5b for forming the contact 6. Then, the pixel electrode 8 is formed on the passivation insulating film 7 in each of pixel regions, filling the contact 6 therewith. The pixel electrode 8 is composed of electrically conductive transparent material such as indium tin oxide (ITO) and has a thickness of about 40 nm.

In the opposing substrate 40 facing the TFT substrate 30, the red, green and blue color filters 12 are arranged on the glass substrate 11 in association with each of pixels, and the overcoating layer 13 and the transparent electrode 14 composed of ITO are formed on the color filters 12.

Then, the alignment films 9 are formed on both the TFT substrate 30 and the opposing substrate 40 such that the alignment films 9 face each other, and then, are oriented in a predetermined direction.

Then, the TFT substrate 30 and the opposing substrate 40 are adhered to each other with the spacers 10 being sandwiched therebetween for ensuring a gap therebetween. Then, liquid crystal is introduced into the gap. Thus, there is completed the active matrix type liquid crystal display device in accordance with the first embodiment.

The active matrix type liquid crystal display device in accordance with the first embodiment and the method of fabricating the same make it possible to form the inactive layer 4c at a surface of the a-Si layer 4a in the back-channel of TFT 4 by (a) applying the first plasma process, that is, the oxygen plasma process to the a-Si layer 4a which process is to be carried out subsequently to the step of etching the a-Si layer 4a for forming a channel, (b) heating the substrate before the deposition of the passivation insulating film 7 in the CVD apparatus, (c) applying the second plasma process, that is, the hydrogen plasma process to the a-Si layer 4a before the deposition of the passivation insulating film 7 in the CVD apparatus, and (d) forming the passivation insulating film 7 at low power. The thus formed inactive layer 4c is more stable than an inactive layer to be formed in a conventional method of forming an active matrix substrate, and suppresses generation of an off-leakage current at the back-channel.

Figure 7A:
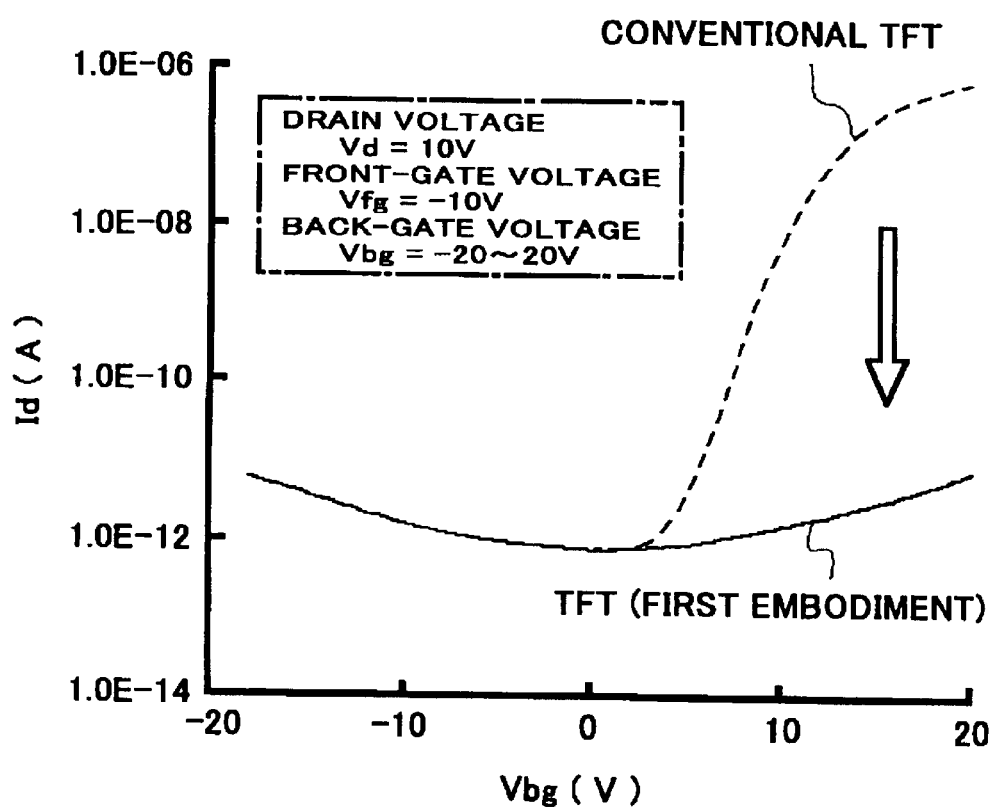
FIGS. 7A and 7B are graphs showing advantages obtained by the active matrix type liquid crystal display device in accordance with the first embodiment and the method of fabricating the same.
Figure 7B:
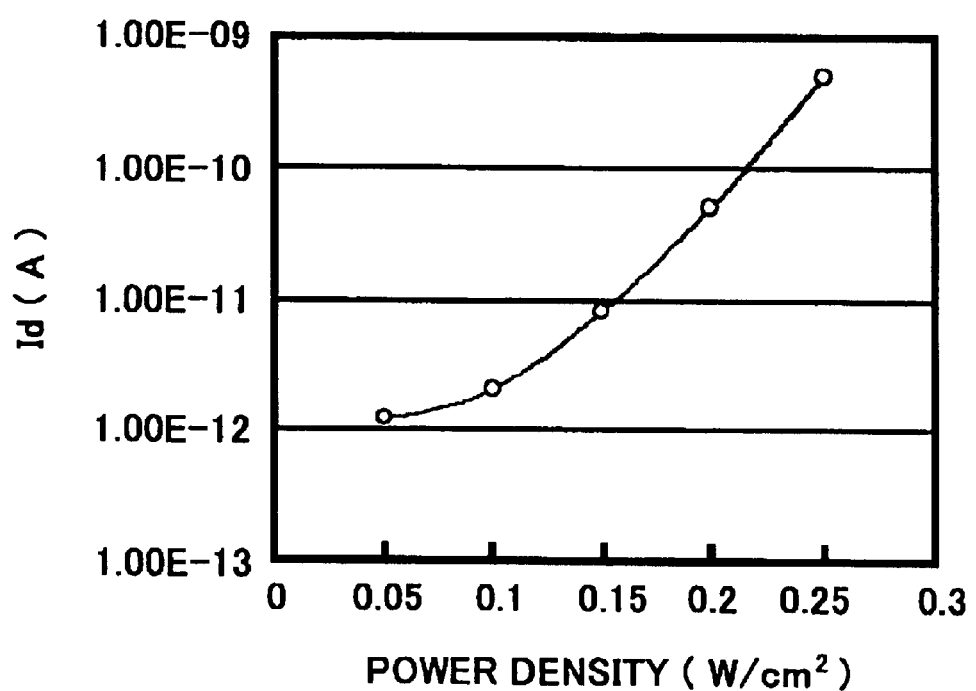

FIGS. 7A and 7B are graphs showing advantages obtained by the above-mentioned active matrix type liquid crystal display device in accordance with the first embodiment and the method of fabricating the same.

FIG. 7A is a graph showing leakage currents Id running across a source and a drain in both a conventional TFT and TFT in accordance with the first embodiment, with a back-gate voltage Vbg being applied in the range of −20V to 20V, and further with a drain voltage Vd being fixed at 10V and a front-gate voltage Vfg being fixed at −10V. In a conventional TFT, only the hydrogen plasma process is applied to an a-Si layer, whereas in the TFT in accordance with the first embodiment, both the oxygen and hydrogen plasma processes are applied to the a-Si layer 4a, the substrate is heated, and the passivation insulating film 7 is formed at low power. The back-gate voltage Vbg in the range of −20V to 20V is determined taking into consideration charging-up caused by the spacers 10 or other factors. The leakage current Id is equivalent to a current obtained when a ratio of a gate width W to a gate length L is set equal to 1 (W/L=1).

As is obvious in FIG. 7A, in the conventional TFT in which only the hydrogen plasma is applied to an a-Si layer, the leakage current Id remarkably increases as the back-gate voltage Vbg increases in a region where the back-gate voltage Vbg is positive (namely, a right-half region in FIG. 7A). In contrast, in the TFT in accordance with the first embodiment, the leakage current Id increases only slightly in a region where the back-gate voltage Vbg is positive. This means that the active matrix type liquid crystal display device in accordance with the first embodiment can effectively suppress generation of an off-leakage current at the back-channel.

FIG. 7B shows a relation between a source-drain current Id and a power density at which the passivation insulating film 7 is formed, which relation is observed in conditions that a drain voltage Vd is set equal to 10V, a front-gate voltage Vfg is set equal to −10V, and a back-gate voltage Vbg is set equal to 10V.

As is obvious in FIG. 7B, if the power density is too high, the a-Si layer 4a would be damaged and there is generated a high leakage current due to a residual stress existing in the passivation insulating film 7, and on the other hand, if the power density is too small, the passivation insulating film 7 would have a deteriorated function of acting as a protection film. Accordingly, there exists a preferable range of the power density in which it is possible to prevent both an increase in a leakage current and reduction in a function of the passivation insulating film 7 as a protection film.

The inventors had conducted the experiments to identify such a preferable range of the power density. In accordance with the results of the experiments, the power density is preferably in the range of 0.05 to 1.0 W/cm$^2$, and more preferably in the range of 0.05 to 0.2 W/cm$^2$.

Though oxygen gas is used in the first plasma process and hydrogen gas is used in the second plasma process in the first embodiment, a gas to be used in the plasma process is not to be limited to those gases. For instance, nitrogen, carbon, boron or helium alone or in combination as well as oxygen and hydrogen might be used in the first and/or second plasma processes.

It is preferable that a gas used in the second plasma process contains an element or elements having an atomic number smaller than an atomic number of at least one of elements constituting a gas to be used in the first plasma process. Accordingly, a combination of oxygen gas to be used in the first plasma process and helium gas to be used in the second plasma process may be selected as well as a combination of oxygen gas to be used in the first plasma process and hydrogen gas to be used in the second plasma process.

In the above-mentioned first embodiment, there are carried out the four steps, that is, the step of applying oxygen plasma to the a-Si layer 4a, the step of applying hydrogen plasma to the a-Si layer 4a, the step of heating the substrate, and the step of forming the passivation insulating film 7 at a low power density. However, since the substrate is heated while hydrogen plasma is applied to the a-Si layer 4a and further while the passivation insulating film 7 is formed at a low power density, it would be possible to reduce an off-leakage current to some degree, even if the step of heating the substrate is not carried out. In addition, a combination of the step of applying oxygen plasma to the a-Si layer 4a and the step of applying hydrogen plasma to the a-Si layer 4a or a combination of the step of applying oxygen plasma to the a-Si layer 4a, the step of applying hydrogen plasma to the a-Si layer 4a and the step of heating the substrate would make it possible to form the inactive layer 4c not only at a surface of the a-Si layer 4c, but also in a region deeper than a surface of the inactive layer 4c, that is, a region into which oxygen atoms could not enter in the first plasma process. Hence, it would be possible to reduce an off-leakage current, even if the passivation insulating film 7 is formed at a normal power density.

In brief, the above-mentioned four steps may be carried out in the following combinations:

(A) a combination of the first plasma process such as oxygen plasma process and the second plasma process such as hydrogen plasma process;

(B) a combination of the first plasma process, the second plasma process and the step of heating the substrate;

(C) a combination of the first plasma process, the second plasma process and the step of forming the passivation insulating film at a low power density; and (D) a combination of the first plasma process, the second plasma process, the step of heating the substrate and the step of forming the passivation insulating film at a low power density.

In the first embodiment, non-bonding hands of silicon existing at a surface of the a-Si layer 4a are terminated with oxygen by introducing oxygen gas into a dry-etching apparatus to thereby apply the oxygen plasma to the a-Si layer 4a for inactivating the back-channel. An off-leakage current could be reduced to some degree also by washing the substrate with ultra-violet (UV) and/or ozone subsequently to the step of dry-etching the a-Si layer 4a for forming a channel.

In accordance with the results of the experiment having been conducted by the inventors, a combination of the first plasma process, the second plasma process and the step of washing the substrate with UV and/or ozone could effectively reduce an off-leakage current.

Second Embodiment

An active matrix type liquid crystal display device in accordance with the second embodiment of the present invention and a method of fabricating the same are explained hereinbelow with reference to FIGS. 8 and 9A to 9E.

The active matrix type liquid crystal display device in accordance with the second embodiment is a channel-protective type active matrix liquid crystal display device having a reverse-stagger structure.

Figure 8:
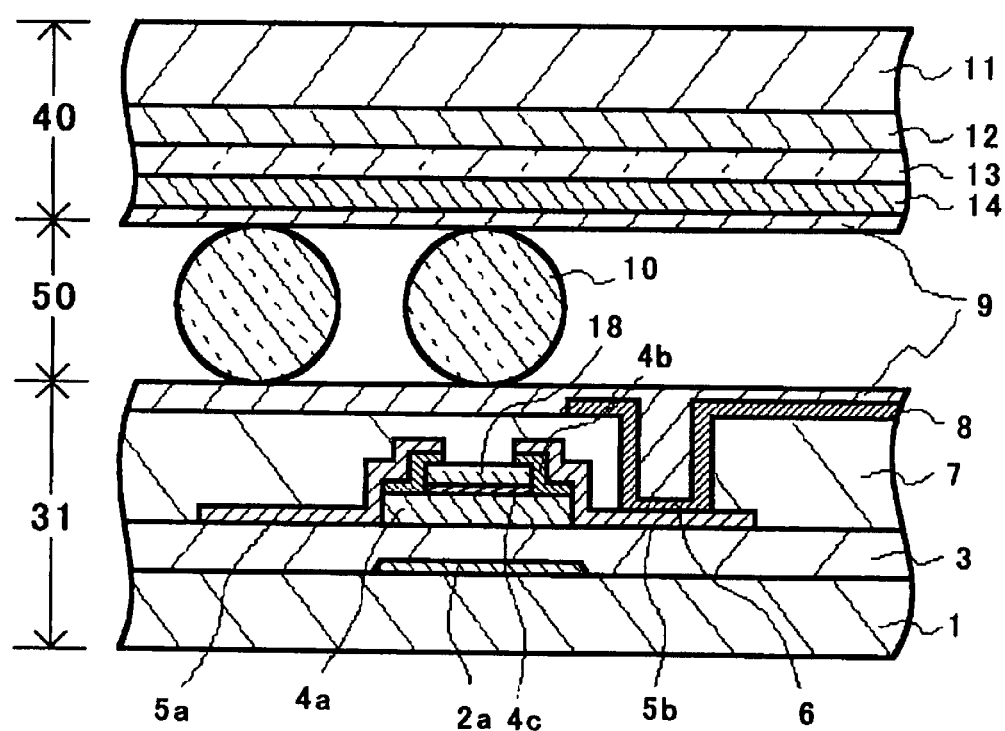
FIG. 8 is a cross-sectional view of the active matrix type liquid crystal display device in accordance with the second embodiment.

FIG. 8 is a cross-sectional view of the active matrix type liquid crystal display device in accordance with the second embodiment.

With reference to FIG. 8, the active matrix type liquid crystal display device in accordance with the second embodiment is comprised of a substrate 31 on which a thin film transistor (TFT) is fabricated (hereinbelow, referred to simply as "TFT substrate 31"), an opposing substrate 40 arranged in facing relation to the TFT substrate 31, and a liquid crystal layer 50 sandwiched between the TFT substrate 31 and the opposing substrate 40.

The TFT substrate 31 is comprised of a glass substrate 1, a gate electrode 2a formed on the glass substrate 1, a gate insulating film 3 formed on the glass substrate 1, covering the gate electrode 2a therewith, an amorphous silicon (hereinbelow, referred to simply as "a-Si") layer 4a formed on the gate insulating film 3 above the gate electrode 2a, an inactive layer 4c formed on the a-Si layer 4a above the gate electrode 2a, a channel-protective layer 18 formed on the inactive layer 4c, an n⁺ a-Si layer 4b formed on the a-Si layer 4a, covering the inactive layer 4c and the channel-protective layer 18 therewith, a drain electrode 5a and a source electrode 5b both formed on the gate insulating film 3, covering the n⁺ a-Si layer 4b therewith around a channel, a passivation insulating film 7 formed on the gate insulating film 3, covering the channel-protective layer 18, the drain electrode 5a and the source electrode 5b therewith, a pixel electrode 8 formed on the passivation insulating film 7 and making electrical contact with the source electrode 5b through a contact 6 formed by partially removing the passivation insulating film 7, and an alignment film 9 covering the passivation insulating film 7 and the pixel electrode 8 therewith.

The opposing substrate 40 in the second embodiment has the same structure as that of the opposing substrate 40 in the first embodiment.

Similarly to the first embodiment, a plurality of spacers 10 are sandwiched between the TFT substrate 31 and the opposing substrate 40 for ensuring a thickness of the liquid crystal layer 50. There is formed a seal (not illustrated) around the liquid crystal layer 50 in order to prevent leakage of liquid crystal.

Hereinbelow is explained a method of fabricating the TFT substrate 31, with reference to FIGS. 9A to 9E.

Figure 9A:
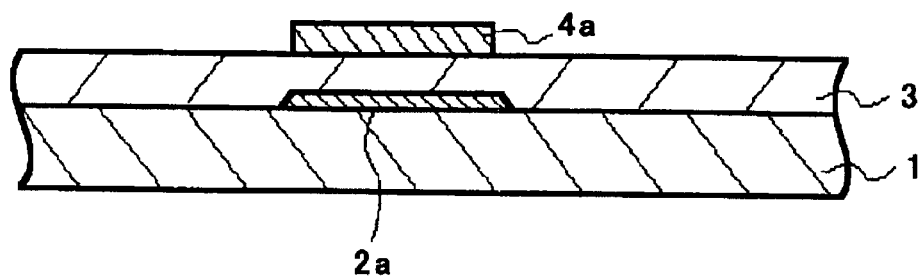
FIGS. 9A to 9E are cross-sectional views of the active matrix type liquid crystal display device in accordance with the second embodiment, illustrating respective steps of a method of fabricating the same.

First, as illustrated in FIG. 9A, a chromium (Cr) film having a thickness of about 200 nm is formed on the glass substrate 1, for instance, by sputtering. Then, the chromium film is patterned into the gate electrode 2a by lithography and dry etching.

Then, the gate insulating film 3 having a thickness of about 500 nm and composed of silicon nitride is formed on the glass substrate 1, for instance, by chemical vapor deposition (CVD). Then, the a-Si layer 4a which will make a semiconductor layer in TFT 4 is formed on the gate insulating film 3. The a-Si layer 4a has a thickness of about 300 nm.

Then the a-Si layer 4a is patterned into an island.

In a conventional method of fabricating a channel-protective type liquid crystal display device, the channel-protective film 18 would be formed on a channel of the a-Si layer 4a.

In contrast, in the second embodiment, the following steps are carried out prior to the formation of the channel-protective film 18 in order to reduce an off-leakage current at a back-channel.

Figure 9B:
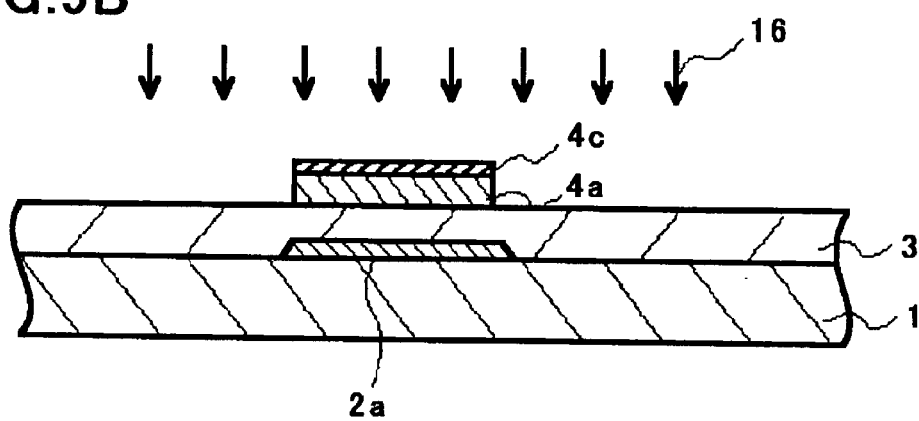

First, as illustrated in FIG. 9B, the resultant is introduced into an apparatus for forming the channel-protective film 18 by CVD. Then, the first plasma process is carried out, that is, oxygen plasma is applied to the a-Si layer 4a to form the inactive layer 4c at a surface of the a-Si layer 4a.

An example of the conditions for carrying out the oxygen plasma process is as follows.

Flow rate of oxygen gas: 800 sccm
Pressure of oxygen gas: 140 Pa
Power density: 0.5 W/cm²
Time: about 20 seconds It is considered that the oxygen plasma process terminates non-bonding hands of silicon existing at a surface of the a-Si layer 4a, with oxygen atoms, to thereby inactivate a surface of the a-Si layer 4a.

Figure 9C:
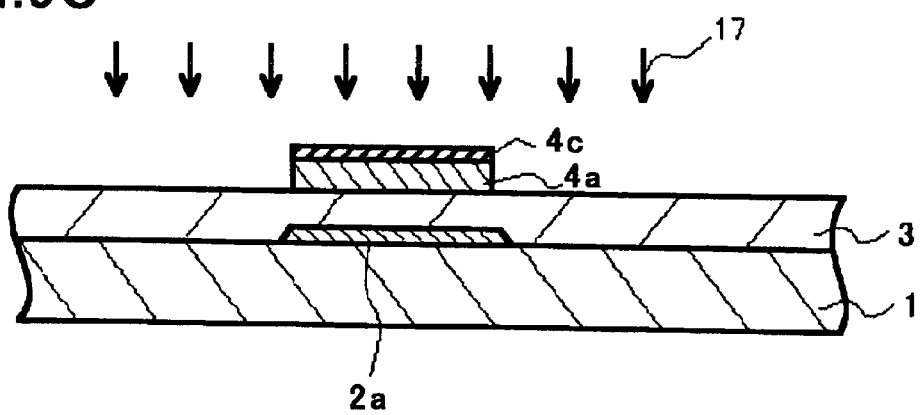

Then, as illustrated in FIG. 9C, the resultant is heated before and/or while hydrogen plasma is applied to the a-Si layer 4a in order to further inactivate a surface of the a-Si layer 4a.

Specifically, the resultant is introduced into an apparatus for carrying out chemical vapor deposition (CVD), and heated at 300±20 degrees centigrade for about 10 minutes, for instance. Then, hydrogen plasma is applied to the resultant for about 10 seconds. For instance, the hydrogen plasma process is carried out in the following conditions.

Flow rate of hydrogen gas: 1000 sccm
Pressure of hydrogen gas: 70 Pa
Power density: 1.0 W/cm²
Temperature of the substrate: about 300 degrees centigrade If the resultant or substrate is heated at a too high temperature, hydrogen having terminated dangling bonds therewith at a surface of the a-Si layer 4a might be released. On the other hand, if the resultant or substrate is heated at a too low temperature, it would not be possible to facilitate termination of dangling bonds with hydrogen at a surface of the a-Si layer 4a.

Accordingly, similarly to the first embodiment, it is preferable to heat the substrate at a temperature in the range of about 250 to 350 degrees centigrade, and more preferably in the range of about 280 to 320 degrees centigrade.

Figure 9D:
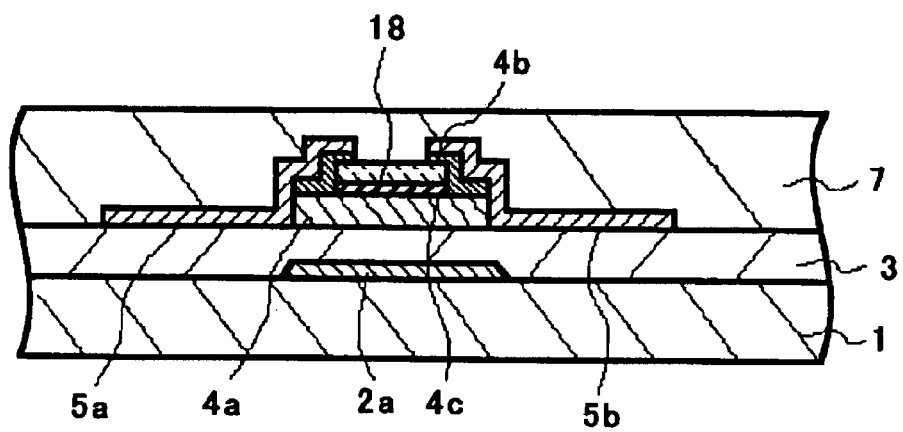

Then, as illustrated in FIG. 9D, a reactive gas is introduced into the CVD apparatus to form the channel-protective film 18 composed of silicon nitride, on the inactive layer 4c. Then, the channel-protective film 18 is etched for removal in a region other than a channel region.

The inactive layer 4c is formed not only on a channel region of TFT, but also on source/drain regions of TFT. If the source and drain electrodes 5a and 5b overlay the inactive layer 4c, transistor characteristics at a front-channel might be deteriorated. Accordingly, in the second embodiment, the inactive layer 4c in a region other than a channel region is also removed when the channel-protective film 18 is etched.

Then, the n⁺ a-Si layer 4b is deposited over the resultant by CVD by the thickness of about 50 nm, and subsequently, patterned into an island TFT region.

Then, a chromium film is deposited over the resultant by sputtering by the thickness of about 150 nm, and subsequently, patterned into the drain lines 5, the drain electrode 5a and the source electrode 5b.

Then, there is formed the passivation insulating film 7 for planarizing the TFT substrate 31. Similarly to the above-mentioned first embodiment, the passivation insulating film 7 is formed at a small power density to prevent the a-Si layer 4a from being damaged when the passivation insulating layer 7 is formed, and to prevent high residual stress from remaining in the passivation insulating film 7 which residual stress would cause a high off-leakage current at a back-channel.

In order to avoid a problem of generation of a high off-leakage current, the passivation insulating film 7 is formed at a power density about five times smaller than a normal power density, similarly to the first embodiment.

An example of the conditions for forming the passivation insulating film 7 in the second embodiment is shown below.

Figure 9E:
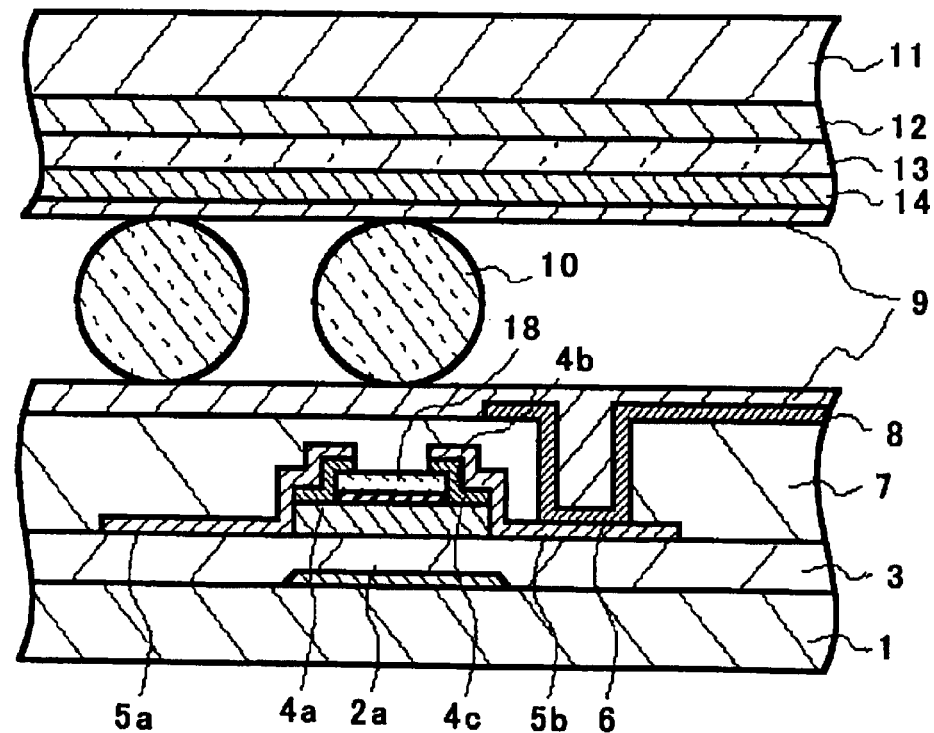

Pressure of reactive gas: 200 Pa
Power density: 0.1 W/cm²
Temperature of the substrate: about 300 degrees centigrade Then, as illustrated in FIG. 9E, the passivation insulating film 7 is partially removed above the source electrode 5b for forming the contact 6. Then, the pixel electrode 8 is formed on the passivation insulating film 7 in each of pixel regions, filling the contact 6 therewith. The pixel electrode 8 is composed of electrically conductive transparent material such as indium tin oxide (ITO).

In the opposing substrate 40 facing the TFT substrate 31, the red, green and blue color filters 12 are arranged on the glass substrate 11 in association with each of pixels, and the overcoating layer 13 and the transparent electrode 14 composed of ITO are formed on the color filters 12.

Then, the alignment films 9 are formed on both the TFT substrate 31 and the opposing substrate 40 such that the alignment films 9 face each other, and then, are oriented in a predetermined direction.

Then, the TFT substrate 31 and the opposing substrate 40 are adhered to each other with the spacers 10 being sandwiched therebetween for ensuring a gap therebetween. Then, liquid crystal is introduced into the gap. Thus, there is completed the active matrix type liquid crystal display device in accordance with the second embodiment.

The active matrix type liquid crystal display device in accordance with the second embodiment and the method of fabricating the same make it possible to form the inactive layer 4c at a surface of the a-Si layer 4a in the back-channel of TFT 4 by (a) applying the first plasma process, that is, the oxygen plasma process to the a-Si layer 4a which process is to be carried out in the CVD apparatus prior to the deposition of the channel-protective film 18, (b) heating the substrate before the deposition of the passivation insulating film 7 in the CVD apparatus, (c) applying the second plasma process, that is, the hydrogen plasma process to the a-Si layer 4a before the deposition of the passivation insulating film 7 in the CVD apparatus, and (d) forming the passivation insulating film 7 at a low power density. The thus formed inactive layer 4c is more stable than an inactive layer to be formed in a conventional method of forming an active matrix substrate, and suppresses generation of an off-leakage current at a back-channel of TFT.

Similarly to the first embodiment, gases to be used in the first and second plasma processes are not to be limited to oxygen and hydrogen gases. For instance, nitrogen, carbon, boron or helium alone or in combination as well as oxygen and hydrogen might be used in the first and/or second plasma processes.

In the above-mentioned first embodiment, there are carried out the four steps, that is, the step of applying oxygen plasma to the a-Si layer 4a, the step of applying hydrogen plasma to the a-Si layer 4a, the step of heating the substrate, and the step of forming the passivation insulating film 7 at a low power density. Similarly to the first embodiment, the step of heating the substrate may be omitted, for instance.

Similarly to the first embodiment, the above-mentioned four steps may be carried out in the following combinations:

(A) a combination of the first plasma process such as oxygen plasma process and the second plasma process such as hydrogen plasma process;

(B) a combination of the first plasma process, the second plasma process and the step of heating the substrate;

(C) a combination of the first plasma process, the second plasma process and the step of forming the passivation insulating film at a low power density; and (D) a combination of the first plasma process, the second plasma process, the step of heating the substrate and the step of forming the passivation insulating film at a low power density.

Though the present invention is applied to an active matrix substrate in which the color filters 12 are formed on the opposing substrate 40, in the first and second embodiments, the present invention is not to be limited to those embodiments. For instance, the present invention may be applied to a COT (color filter on TFT) structure in which the color filters 12 are formed on the TFT substrate 30 or 31.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 2001-146147 and 2002-132556 filed on May 16, 2001 and May 8, 2002, respectively, each including specification, claims, drawings and summary is incorporated herein by reference in its entirety.

What is claimed is:

1. A method of fabricating a thin film transistor, comprising:

forming a semiconductor layer above an electrically insulating substrate;

applying a first plasma to said semiconductor layer through the use of a first gas; and applying a second plasma to said semiconductor layer through the use of a second gas to deactivate a portion of said semiconductor layer deeper than a portion deactivated by said first plasma.

2. The method as set forth in claim 1, wherein said semiconductor layer comprises one of amorphous silicon or and polysilicon.

3. The method as set forth in claim 1, wherein each of said first and second gases comprises at least one of oxygen (O), nitrogen (N), carbon (C), boron (B), hydrogen (H) and helium (He).

4. The method as set forth in claim 3, wherein said first gas comprises oxygen, and said second gas comprises hydrogen and nitrogen.

5. The method as set forth in claim 1, further comprising:

heating said electrically insulating substrate at a predetermined temperature before applying said second plasma to said semiconductor layer.

6. The method as set forth in claim 5, wherein said predetermined temperature is in a range of 250 degrees centigrade to 350 degrees centigrade both inclusive.

7. The method as set forth in claim 5, wherein said predetermined temperature is in a range of 280 degrees centigrade to 320 degrees centigrade both inclusive.

8. The method as set forth in claim 5, wherein said heating said electrically insulating substrate at said predetermined temperature is carried out for at least ten minutes.

9. The method according to claim 5, wherein said heating said electrically insulating substrate is performed before said forming of said semiconductor layer.

10. The method according to claim 5, wherein said heating said electrically insulting substrate at a predetermined temperature and applying said second plasma to said semiconductor layer are performed simultaneously.

11. The method as set forth in claim 1, wherein said second gas comprises an element having an atomic number smaller than an atomic number of at least one element of said first gas.

12. A method of fabricating a thin film transistor, comprising:

forming a gate electrode on an electrically insulating substrate;

forming a gate insulating film on said electrically insulating substrate, covering said gate electrode therewith;

forming a semiconductor layer on said gate insulating film above said gate electrode;

forming source and drain electrodes both making electrical contact with said semiconductor layer;

patterning said semiconductor layer into a channel;

applying a first plasma to said semiconductor layer through the use of a first gas;

applying a second plasma to said semiconductor layer through the use of a second gas to deactivate a portion of said semiconductor layer deeper than a portion deactivated by said first plasma; and forming an electrically insulating film covering said semiconductor layer therewith.

13. The method as set forth in claim 12, wherein said semiconductor layer comprises one of amorphous silicon and polysilicon.

14. The method as set forth in claim 12, wherein each of said first and second gases comprises at least one of oxygen (O), nitrogen (N), carbon (C), boron (B), hydrogen (H) and helium (He).

15. The method as set forth in claim 10, wherein said first gas comprises oxygen, and said second gas comprises hydrogen and nitrogen.

16. The method as set forth in claim 12, further comprising:

heating said electrically insulating substrate at a predetermined temperature before applying said second plasma to said semiconductor layer.

17. The method as set forth in claim 16, wherein said predetermined temperature is in a range of 250 degrees centigrade to 350 degrees centigrade both inclusive.

18. The method as set forth in claim 16, wherein said predetermined temperature is in a range of 280 degrees centigrade to 320 degrees centigrade both inclusive.

19. The method as set forth in claim 16, wherein said heating said electrically insulating substrate at said predetermined temperature is carried out for at least ten minutes.

20. The method as set forth in claim 12, wherein said electrically insulating film is formed at power in a range of 0.05 to 1.0 W/cm$^2$ both inclusive.

21. The method as set forth in claim 12, wherein said electrically insulating film is formed at power in a range of 0.05 to 0.2 W/cm$^2$ both inclusive.

22. The method as set forth in claim 12, wherein said second gas comprises an element having an atomic number smaller than an atomic number of at least one element of said first gas.

23. A method of fabricating a thin film transistor, comprising :

forming a semiconductor layer in a film-forming apparatus;

introducing a first gas into said film-forming apparatus to apply a first plasma to said semiconductor layer;

introducing a second gas into said film-forming apparatus to apply a second plasma to said semiconductor layer to deactivate a portion of said semiconductor layer deeper than a portion deactivated by said first plasma;

patterning said semiconductor layer into a channel;

forming a channel protection layer over said channel in said film-forming apparatus; and forming an electrically insulating film covering said semiconductor layer therewith.

24. The method as set forth in claim 23, wherein said semiconductor layer comprises one of amorphous silicon and polysilicon.

25. The method as set forth in claim 23, wherein each of said first and second gases comprises at least one of oxygen (O), nitrogen (N), carbon (C), boron (B), hydrogen (H) and helium (He).

26. The method as set forth in claim 25, wherein said first gas comprises oxygen, and said second gas comprises hydrogen and nitrogen.

27. The method as set forth in claim 23, further comprising:

heating said electrically insulating substrate at a predetermined temperature before applying said second plasma to said semiconductor layer.

28. The method as set forth in claim 27, wherein said predetermined temperature is in a range of 250 degrees centigrade to 350 degrees centigrade both inclusive.

29. The method as set forth in claim 27, wherein said predetermined temperature is in a range of 280 degrees centigrade to 320 degrees centigrade both inclusive.

30. The method as set forth in claim 27, wherein said heating said electrically insulating substrate at said predetermined temperature is carried out for at least ten minutes.

31. The method as set forth in claim 23, wherein said electrically insulating film is formed at power in a range of 0.05 to 1.0 W/cm$^2$ both inclusive.

32. The method as set forth in claim 23, wherein said electrically insulating film is formed at power in a range of 0.05 to 0.2 W/cm$^2$ both inclusive.

33. The method as set forth in claim 23, wherein said second gas comprises an element having an atomic number smaller than an atomic number of at least one element of said first gas.

* * * * *